United States Patent
Henderson et al.

(10) Patent No.: US 7,058,782 B2
(45) Date of Patent: Jun. 6, 2006

(54) METHOD AND APPARATUS FOR COORDINATING DYNAMIC MEMORY DEALLOCATION WITH A REDUNDANT BIT LINE STEERING MECHANISM

(75) Inventors: Daniel James Henderson, Georgetown, TX (US); Alongkorn Kitamorn, Austin, TX (US); Wayne L. Lemmon, Rochester, MN (US); Naresh Nayar, Rochester, MN (US); Ravi A. Shankar, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 10/631,067

(22) Filed: Jul. 31, 2003

(65) Prior Publication Data

US 2005/0028039 A1    Feb. 3, 2005

(51) Int. Cl.
*G06F 12/00* (2006.01)

(52) U.S. Cl. .......................... 711/170; 714/764; 714/6; 714/7; 714/42; 714/49

(58) Field of Classification Search ...................... None
See application file for complete search history.

(56) References Cited

U.S. PATENT DOCUMENTS

| | | | | |
|---|---|---|---|---|
| 5,263,032 A | * | 11/1993 | Porter et al. ................. | 714/764 |
| 5,267,242 A | * | 11/1993 | Lavallee et al. ............... | 714/7 |
| 5,428,525 A | * | 6/1995 | Cappelaere et al. .......... | 700/49 |
| 5,761,413 A | * | 6/1998 | Frank et al. ................... | 714/49 |
| 6,101,614 A | * | 8/2000 | Gonzales et al. .............. | 714/6 |
| 6,604,177 B1 | * | 8/2003 | Kondo et al. ................ | 711/150 |
| 2001/0047497 A1 | * | 11/2001 | Larson et al. ................. | 714/42 |
| 2004/0199813 A1 | * | 10/2004 | Hillman et al. ............... | 714/13 |

\* cited by examiner

*Primary Examiner*—Kevin Verbrugge
*Assistant Examiner*—Shawn Gu
(74) *Attorney, Agent, or Firm*—Duke W. Yee; Mark E. McBurney; Theodore D. Fay III (57) ABSTRACT

A method and apparatus for coordinating dynamic memory page deallocation with a redundant bit line steering mechanism are provided. With the method and apparatus, memory scrubbing and redundant bit line steering operations are performed in parallel with handling of notifications of runtime correctable errors. When a correctable error is encountered during runtime, and the correctable error is determined to be persistent, then dynamic memory page deallocation is requested of a hypervisor. The determination of persistence is based on a history CE table that is populated by the operation of the memory scrubbing and redundant bit line steering mechanism of a service processor. Thus, only those correctable errors that persist for longer than one memory scrubbing cycle are subject to memory page deallocation.

21 Claims, 5 Drawing Sheets

METHOD AND APPARATUS FOR COORDINATING DYNAMIC MEMORY DEALLOCATION WITH A REDUNDANT BIT LINE STEERING MECHANISM

BACKGROUND OF THE INVENTION

1. Technical Field

The present invention is generally directed to an improved computing system. More specifically, the present invention is directed to a mechanism for coordinating dynamical memory deallocation with redundant bit line steering to correct errors in memory.

2. Description of Related Art

Protecting a system from memory errors becomes increasingly more important as the total amount of memory in a system increases. Different techniques have been used to increase the overall reliability of a system in the face of memory errors. Generally, these techniques can be categorized into one of three main areas: tolerating the memory fault, i.e. error, fixing the memory fault, and avoiding the memory fault.

Several techniques can be used to tolerate memory faults in a system. One such technique is the use of an error correcting code (ECC) memory. An ECC memory is a memory system that tests for and corrects errors automatically, very often without the operating system or the user being aware of it. When writing the data into memory, ECC circuitry generates checksums from the binary sequences in the bytes and stores them in an additional seven bits of memory for 32-bit data paths or eight bits for 64-bit paths (other ECCs may use 12 or 16 bits, for example). When data are retrieved from memory, the checksum is recomputed to determine if any of the data bits have been corrupted. Such systems can typically detect and automatically correct errors of one bit per word and can detect, but not correct, errors greater than one bit. A memory word that is protected with ECC is referred to herein as an ECC word.

Another technique is bit-scattering, sometimes known as Chipkill detection and correction. Bit-scattering is a technique of allocating bits within an ECC word such that any given ECC word contains no more than one bit from a given memory module. This technique ensures that even a catastrophic failure of a memory module, while it may cause multiple ECC words to have a correctable error, cannot by itself result in an unrecoverable memory error.

These techniques, while they correct the data actually used by the system, do not eliminate the faults at the memory module level. That is, with these techniques, a system that experienced a catastrophic memory module failure would constantly have a correctable error in each ECC word it contributes to. Any fault in any other module in any of these ECC words would then result in an uncorrectable error.

Another technique for tolerating memory faults is to use memory-mirroring. Memory mirroring is a technique that requires having double the amount of memory in a system than will logically be seen by the operating system. Each memory write would actually be sent to two different ECC words in separate memory hardware. An "uncorrectable error" in an ECC word would not be uncorrectable in such a system because the word with the error would be refetched from the redundant ECC word. This technique gives very high tolerance to errors, but is an expensive approach especially for systems having a large amount of memory.

If a memory error is a random soft event, i.e. a fixable event, such as that caused by an alpha or cosmic ray particle, it is possible to fix the memory fault so that it is not encountered again. This can be done when a correctable memory error is encountered in the computing system. It can also be done proactively before the memory with the fault is accessed by the operating system or system firmware.

The most common technique for fixing a memory fault of this type is to perform memory scrubbing. Memory scrubbing is a technique for proactively correcting soft event memory faults. Memory scrubbing involves reading memory in a system, looking for an error, and writing back good "ECC corrected" data when an error is found.

Memory scrubbing can be accomplished by hardware in the background of the operating system during system operation. In such a technique, all of the memory in the system can be scrubbed regardless of how the memory is used by any software layer. Scrubbing can be performed ideally without a performance impact. Some hardware scrubbing mechanisms may also be superior to software techniques in that they can tolerate encountering uncorrectable errors when reading memory during a scrub cycle and potentially fix one of the bits in the uncorrectable error before system software ever accessed the faulty ECC word.

However, if a system has an uncorrectable memory error, it is vital that the system have a mechanism for avoiding the memory fault. If the fault remains in the system memory, it is worthwhile to avoid the fault, even though the fault may be correctable, to prevent a future alignment of the correctable fault with another correctable error in the same ECC word which would result in an uncorrectable error. Some techniques for avoiding a memory fault include redundancy and deallocation.

Redundancy is perhaps the best mechanism for avoiding a memory fault and involves substituting good memory for the faulty memory. This requires that there be some amount of redundant memory available. From a protection point of view, the best case is to have full memory redundancy. In systems with full memory redundancy, each memory write can be mirrored to a redundant module allowing complete memory protection even for uncorrectable errors. Having full memory redundancy, however, is the most expensive technique for providing memory protection and is often not practical in large system environments where memory becomes too expensive to completely duplicate for protection purposes.

Other schemes for redundancy allow for some extra memory to be included in the system and used when needed. One such technique is redundant bit steering, or redundant bit line steering. Redundant bit steering presumes having at least one spare memory bit in a memory module. In this scheme, a memory module with a bad system memory bit could have the bit excluded from an ECC word and replaced with a system memory bit from a spare memory module. Having an entire spare memory module ensures that a catastrophic failure of a memory module could be entirely repaired by replacing each system bit with that from the spare memory module.

Absent actual redundancy, another mechanism for avoiding a memory fault is to not let the system make use of the memory with the fault, i.e. deallocating the memory that has the fault. This is known as deallocation of memory and is typically done only in hardware when a system is restarted. Alternatively, deallocation of memory may be performed in software dynamically during system operation with the cooperation of the operating system.

Dynamic deallocation may be performed by allowing all of the memory to be available to the operating system, but to communicate to the operating system what portion of the memory should be avoided. This is typically done in terms of memory "pages" where a memory page is a fixed-size collection of memory words at successive memory addresses. Thus, the deallocation of memory pages is referred to as memory page deallocation or dynamic memory page deallocation if it can be done during system operation when a memory fault is detected without having to restart the computing system or operating system.

Memory page deallocation may provide advantages over simply deallocating memory at the hardware level. Generally, memory page deallocation allows a smaller amount of memory to be deallocated than is possible to be deconfigured at the hardware level. Hardware deallocation of memory can also affect the way the different ECC word are interleaved at an address level and this may affect the performance of the computing system.

Generally, redundant bit steering is implemented to remove errors that are more severe than single cell, i.e. single bit, faults. Redundant bit steering is superior to dynamic memory page deallocation in that the memory is removed without changing the amount of memory available to the computing system. This allows memory with such a fault to be repaired, possibly even without requiring that the memory be removed from the system.

Using dynamic memory page deallocation to remove an entire failed memory module results in a large number of memory pages being deleted and may be practically prohibitive. Certainly any such memory repair, if attempted, would be considered temporary only and the failed memory would need to be replaced. On the other hand, removing the occasional single cell fault generally results in very minimal impact to the overall performance of the computing system and may be tolerated permanently in a system.

In the prior art, redundant bit steering and dynamic memory page deallocation are mutually exclusive. That is, a system either uses redundant bit steering or dynamic memory page deallocation. There is no known system that provides a combined approach to avoiding memory faults. However, the availability of a computing system may be improved by combining both approaches. Therefore, it would be beneficial to have a method and apparatus for coordinating dynamic memory page deallocation with redundant bit steering to avoid memory faults.

SUMMARY OF THE INVENTION

The present invention provides a method and apparatus for coordinating dynamic memory page deallocation with a redundant bit line steering mechanism. With the method and apparatus, memory scrubbing and redundant bit line steering operations are performed in parallel with handling of notifications of runtime correctable errors. When a correctable error is encountered during runtime, and the correctable error is determined to be persistent, then dynamic memory page deallocation is requested of a hypervisor and an operating system in a partition. The determination of persistence is based on a history CE table that is populated by the operation of the memory scrubbing and redundant bit line steering mechanism of a service processor. Thus, only those correctable errors that persist for longer than one memory scrubbing cycle are subject to memory page deallocation.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

The present invention provides a mechanism for combining redundant bit steering and dynamic memory page deallocation to obtain an improvement in the availability of memory in a computer system. The mechanisms of the present invention may be implemented in any computing device in which memory is present and in which avoidance of memory faults is desirable. In particular, the present invention is applicable to servers, mainframe computers, client computers and stand-alone computing systems. Therefore, a brief explanation of these exemplary computing devices will not be provided in order to provide a context for the description of the mechanisms of the present invention.

Figure 1:
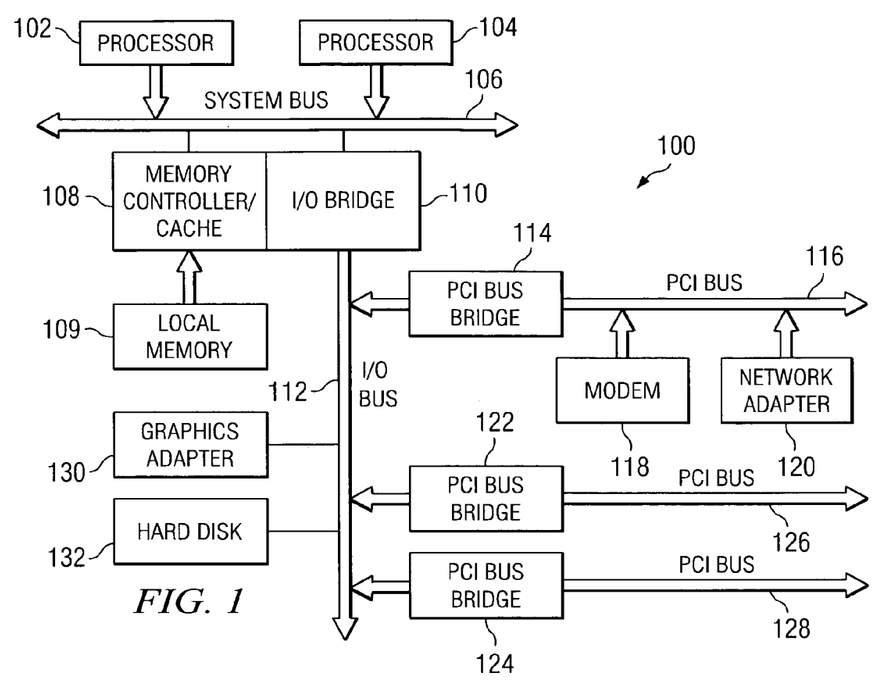
FIG. 1 is an exemplary block diagram of a server or mainframe data processing system in which the present invention may be implemented.

Referring to FIG. 1, a block diagram of a data processing system that may be implemented as a server or mainframe computer is depicted in accordance with a preferred embodiment of the present invention. Data processing system 100 may be a symmetric multiprocessor (SMP) system including a plurality of processors 102 and 104 connected to system bus 106. Alternatively, a single processor system may be employed. Also connected to system bus 106 is memory controller/cache 108, which provides an interface to local memory 109. I/O bus bridge 110 is connected to system bus 106 and provides an interface to I/O bus 112. Memory controller/cache 108 and I/O bus bridge 110 may be integrated as depicted.

Peripheral component interconnect (PCI) bus bridge 114 connected to I/O bus 112 provides an interface to PC local bus 116. A number of modems may be connected to PCI local bus 116. Typical PCI bus implementations will support four PCI expansion slots or add-in connectors. Communications links to clients may be provided through modem 118 and network adapter 120 connected to PCI local bus 116 through add-in boards.

Additional PCI bus bridges 122 and 124 provide interfaces for additional PCI local buses 126 and 128, from which additional modems or network adapters may be supported. In this manner, data processing system 100 allows connections to multiple network computers. A memory-mapped graphics adapter 130 and hard disk 132 may also be connected to I/O bus 112 as depicted, either directly or indirectly.

Those of ordinary skill in the art will appreciate that the hardware depicted in FIG. 1 may vary. For example, other peripheral devices, such as optical disk drives and the like, also may be used in addition to or in place of the hardware depicted. The depicted example is not meant to imply architectural limitations with respect to the present invention.

The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Figure 2:
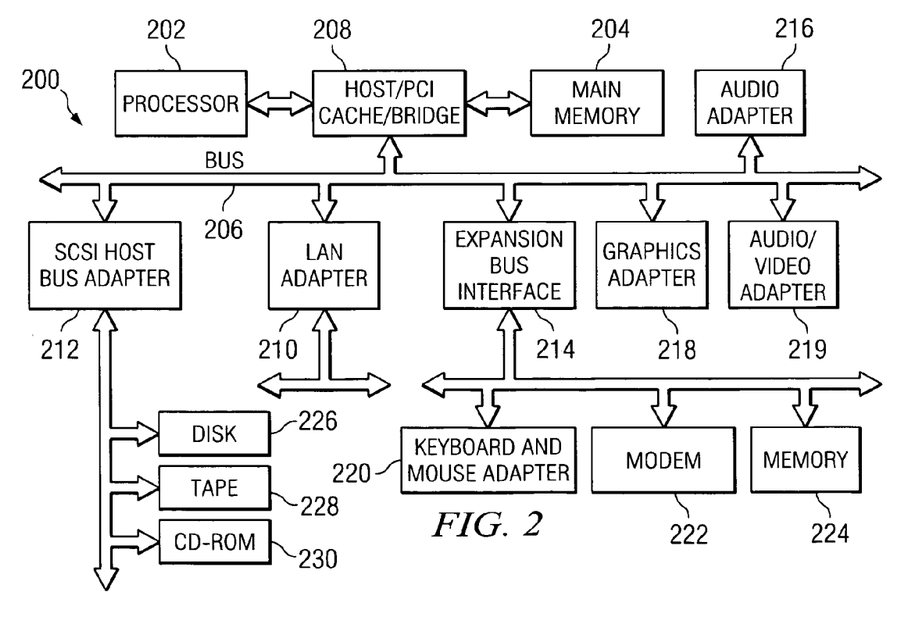
FIG. 2 is an exemplary block diagram of a client or stand alone computing system in which the present invention may be implemented.

With reference now to FIG. 2, a block diagram illustrating a data processing system is depicted in which the present invention may be implemented. Data processing system 200 is an example of a client computer or stand-alone computing system in which the present invention may be implemented. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. Small computer system interface (SCSI) host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system, such as Windows XP, which is available from Microsoft Corporation. An object oriented programming system such as Java may run in conjunction with the operating system and provide calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

As another example, data processing system 200 may be a stand-alone system configured to be bootable without relying on some type of network communication interfaces. As a further example, data processing system 200 may be a personal digital assistant (PDA) device, which is configured with ROM and/or flash ROM in order to provide nonvolatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

As previously mentioned above, the memories in the server, mainframe, client, or stand-alone computing devices described in FIGS. 1 and 2 may be susceptible to memory faults. Therefore, it is important that these computing devices and systems have a memory fault handling mechanism available for either tolerating, fixing or avoiding the memory fault. The present invention provides a memory fault handling mechanism which makes use of a combination of dynamic memory page deallocation and redundant bit steering to handle correctable memory faults.

Prior to the present invention, no known system makes use of a combination of dynamic memory page deallocation and redundant bit steering to handle correctable memory faults. In fact, without taking special care to integrate these two techniques, the two techniques are actually not very complementary.

For example, suppose memory page deallocation were implemented in a system for any cell that achieved a threshold of soft errors. Suppose further that redundant bit steering were implemented for system bit failures and that these two methods were not coordinated. If a system bit line were to start to experience errors, it is possible that the memory page deallocation mechanism would deallocate a number of individual pages associated with the bit line due to runtime correctable errors before a memory scrubbing procedure had the chance to scrub the memory extent with the bit line in question. When scrubbing reaches the page in question, redundant bit steering would be used to fix the memory line that was bad. However, the pages already deallocated would still be deallocation after the redundant bit steering was complete. Thus, the system would suffer from the loss of memory pages due to the memory page deallocation and the loss of further capacity to dynamically steer system bits for future failures.

The present invention provides a mechanism for coordinating dynamic memory page deallocation with redundant bit steering such that any memory page deallocation associated with memory cells that would best be corrected by the use of redundant steering is avoided. This coordination, in the present invention, is based on a time-based thresholding mechanism where no error will be taken as a candidate for memory page deallocation unless it is seen to have persisted longer than the interval of time it takes to scrub the memory associated with the address. In this mechanism, memory scrubbing is used to detect candidates for redundant bit steering. Hence the mechanism always permits redundant bit steering to correct errors in a memory extent that might contain memory cell and bit line errors before using memory page deallocation to perform the correction.

Figure 3:
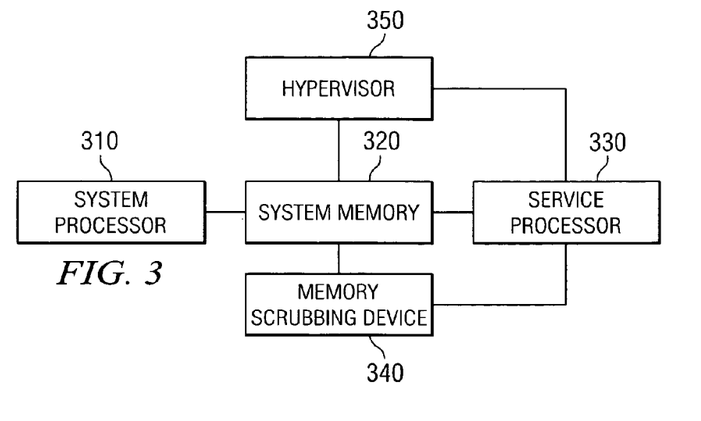
FIG. 3 is an exemplary block diagram illustrating the primary operational components of one exemplary embodiment of the present invention.

FIG. 3 is an exemplary block diagram illustrating the primary operational components of one exemplary embodiment of the present invention. The operational components illustrated in FIG. 3 are part of a computing system such as that illustrated in either of FIG. 1 or 2.

As illustrated in FIG. 3, the primary operational components include a system processor 310, system memory 320, a service processor 330, a memory scrubbing mechanism 340, and a hypervisor 350. The service processor 330 runs code independent of the system processor 310 and system memory 320. The service processor 330 is capable of being informed whenever an operating system or system firmware encounters a correctable memory error during runtime. It is presumed that the service processor 330 has other duties besides managing correctable errors in accordance with the present invention and the correctable error management of the present invention is limited in terms of the service processor resources it can be allowed to consume. However, a dedicated service processor 330 may also be utilized with the present invention such that the service processor's primary function is to perform the correctable error management according to the present invention.

The memory scrubbing mechanism 340 is used to scrub the system memory 320 and reports aggregate error counts to the service processor 330. Faults discovered by the scrubbing, including uncorrectable errors, are contained within the scrubbing operation and do not harm system operation, e.g., the system will not crash when a scrubbing cycle encounters an uncorrectable error.

The memory scrubbing mechanism 340 may be implemented as a hardware memory scrubbing mechanism or a software memory scrubbing mechanism. In a preferred embodiment, the memory scrubbing mechanism 340 is a hardware memory scrubbing mechanism that may be part of a memory controller or may be part of a separate dedicated hardware device. Hardware memory scrubbing is distinguished from software memory scrubbing in that it is the memory controller, or other hardware device, itself which executes the scrubbing read and write operations independent of any operating system. Software memory scrubbing mechanisms are not independent of the operating system.

The hypervisor 350 communicates with the service processor 330 and manages the mapping of a real memory address to a logical memory address that can be used by operating systems above the hypervisor layer. The hypervisor 350 also helps to partition the system into a number of logical partitions. Each logical partition runs its own image of an operating system using some portion of system resources, e.g., processors and memory, given to it by the hypervisor 350. Of course, the present invention may be implemented in systems that do not make use of a hypervisor 350, i.e., do not make use of a logical partitioning, without departing from the spirit and scope of the present invention.

The service processor 330 is primarily responsible for determining when to make a dynamic memory page deallocation request. The service processor 330 receives an attention interrupt each time a runtime correctable error is encountered by the system, as reported by the memory controller. The service processor 330 is able to mask off these interrupts discarding any interrupts that may occur while interrupts are masked. In addition, the service processor 330 is capable of managing the memory scrubbing mechanism 340 within the hardware for each memory controller in the computer system. This includes being informed whenever a scrub cycle has been completed.

The following description will assume a single memory controller system. However, it should be appreciated that the same operation may be performed for each memory controller in a system.

Figure 4A:
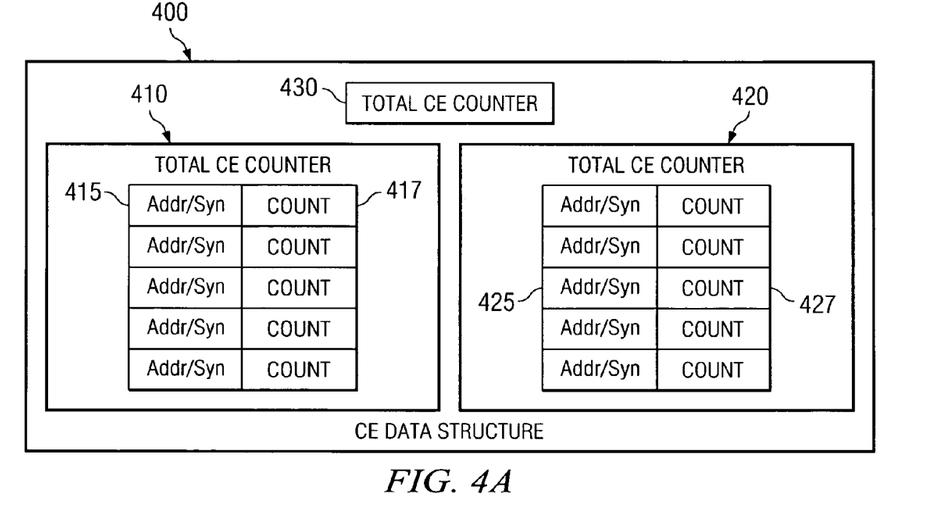
FIG. 4A is an exemplary diagram of an exemplary correctable error data structure in accordance with one embodiment of the present invention.
Figure 4B:
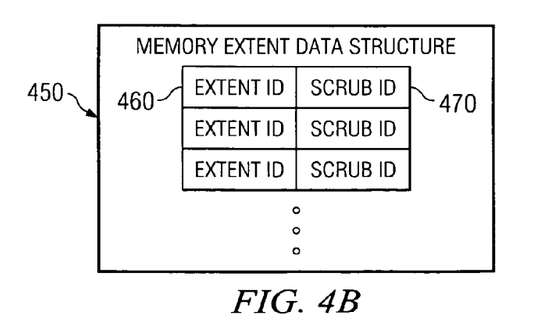
FIG. 4B is an exemplary diagram of an exemplary memory extent data structure in accordance with one embodiment of the present invention.

The service processor 330 maintains a correctable error (CE) data structure and a memory extent data structure, such as the data structures illustrated in FIGS. 4A and 4B. As shown in FIG. 4A, the CE data structure 400 includes a current correctable error table 410 and a history correctable error table 420 that contains the address/syndrome of discovered correctable errors where the address and syndrome point to a specific memory cell. Each entry in the tables 410–420 includes an address/syndrome of the memory cell 415, 425 and a count of the number of times a correctable error has been detected for that address/syndrome 417, 427. The population of these tables and the incrementing of the counts for the entries in these tables is discussed in greater detail hereafter.

The CE data structure 400 further includes a total CE count 430. The total CE count is incremented with each correctable error notification that is received by the service processor 330, as described in more detail hereafter.

As shown in FIG. 4B, the memory extent data structure 450 includes a memory extent identifier 460 and corresponding scrubbed identifier 470. As each memory extent is scrubbed, the scrubbed identifier 470 associated with the corresponding memory extent identifier 460 is set. The scrubbed identifiers 470 may be periodically reset to reinitialize memory scrubbing.

The operation of the service processor 330 with regard to the CE data structure 400 and the memory extent data structure 450 is illustrated with regard to the flowcharts of FIGS. 5–7C. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

Figure 5:
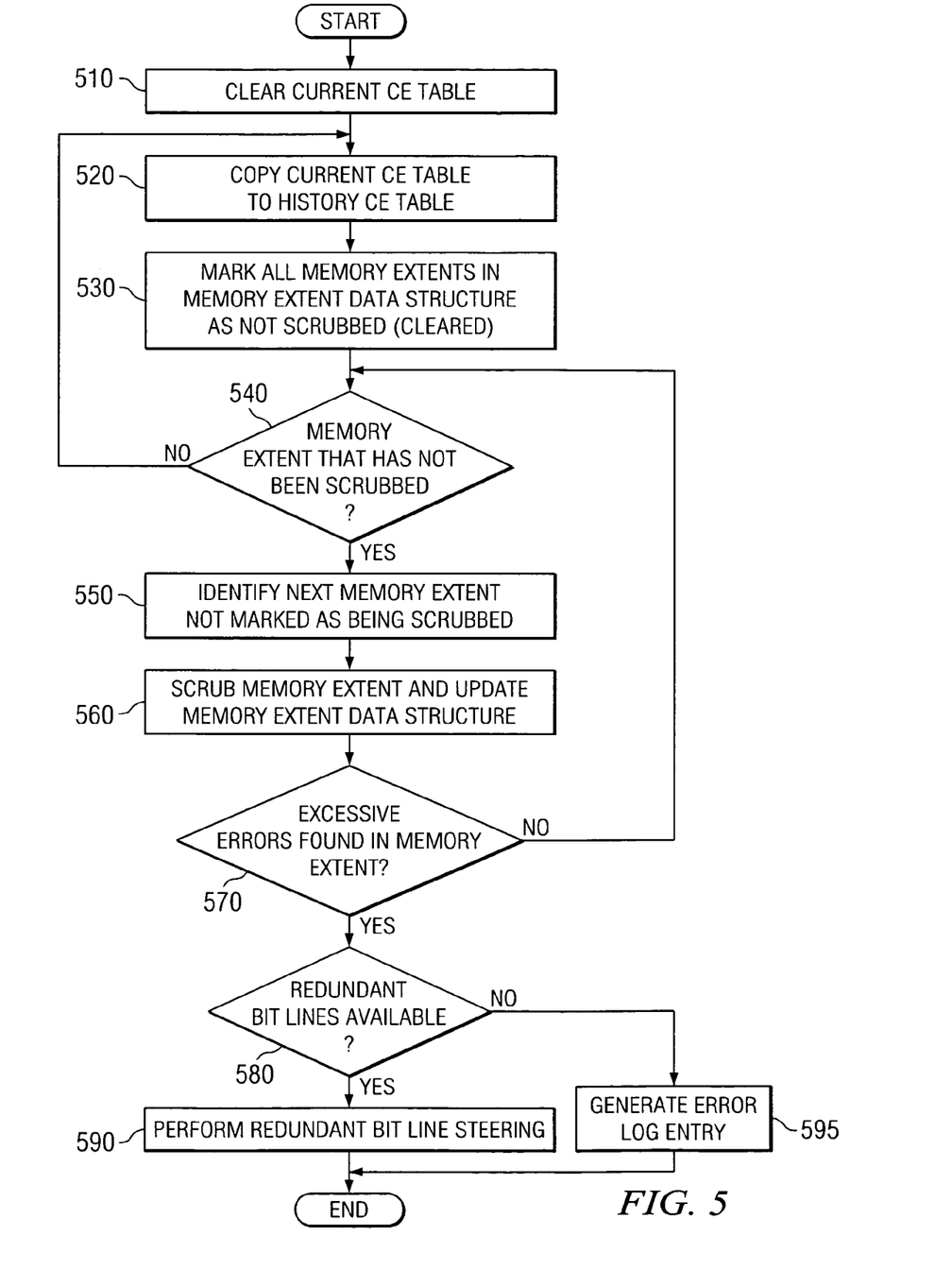
FIG. 5 is a flowchart outlining an exemplary operation according to the present invention for performing a memory scrub and redundant bit line steering.

FIG. 5 is a flowchart outlining an exemplary operation according to the present invention for performing a memory scrub and redundant bit line steering. As shown in FIG. 5, the operation of the service processor 330 starts by clearing the current CE table (step 510). The current CE table is then copied to the history CE table (step 520). If the current CE table contains any entries, they are cleared. The global counter of correctable errors is set to zero. All the memory extents in the memory extent data structure in the service processor controlling scrubbing are marked as cleared indicating that a new scrub cycle is ready to be performed (step 530).

A determination is made as to whether there is a memory extent that is not yet marked as having been scrubbed (step 540). If not, i.e. all of the memory extents have been scrubbed, then the operation returns to step 520 and prepares for a new scrubbing cycle. If there is a memory extent that is not yet marked as having been scrubbed, the next such memory extent is identified (step 550). The identified memory extent is scrubbed and the memory extent data structure is updated to indicate the scrubbing of the memory extent (step 560).

A determination is then made as to whether excessive errors were found in the memory extent that was scrubbed (step 570). This determination may be, for example, by determining if a predetermined threshold number of allowable errors have been exceeded in the memory extent. If there was not an excessive number of errors found, the operation returns to step 540. If there were an excessive number of errors found, a determination is made as to whether there are redundant bit line(s) left to steer the system bit line(s) identified as having errors (step 580).

If there are redundant bit lines available, the system bit line(s) associated with the memory extent that experienced errors are steered out using redundant bit line steering (step 590). If there are not enough redundant bit lines available, an error is logged notifying the system administrator of the problem if an entry was not already logged (step 595). The operation then returns to step 540.

The memory scrubbing described in FIG. 5 may be performed as a background operation during run-time system operation so that a single scrub of memory is done within a certain time period. For example, the system may be set up such that every 24 hours all of the memory will be scrubbed.

Figure 6:
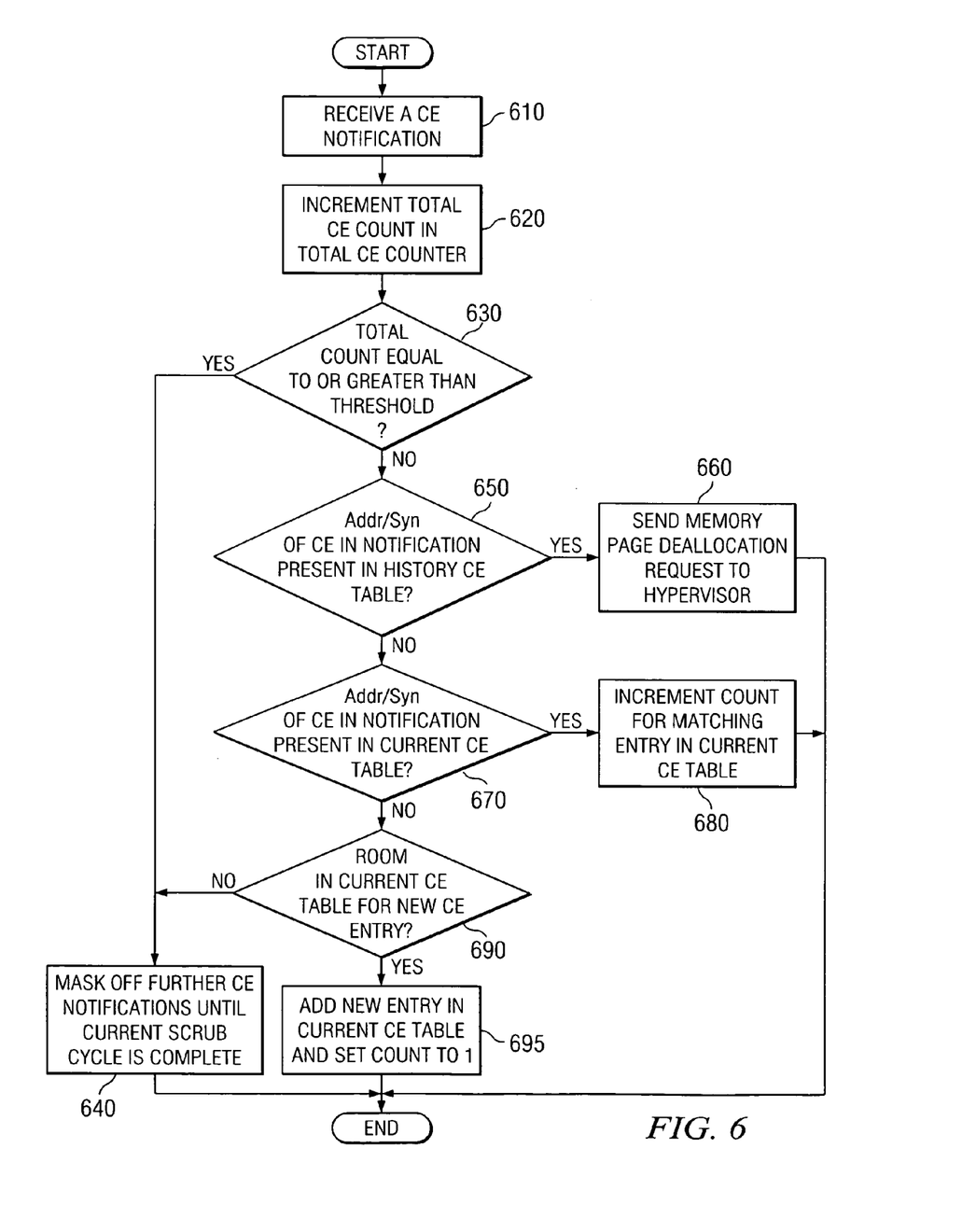
FIG. 6 is a flowchart outlining an exemplary operation of the present invention when processing a notification of a correctable error.

In parallel with the operation illustrated in FIG. 5, the service processor 330 also handles notifications, e.g., interrupts, whenever a runtime correctable error is detected during system operation. The service processor 330 does not receive notifications of correctable errors discovered by the scrubbing mechanism. FIG. 6 illustrates an exemplary operation of the service processor 330 when a notification of a correctable error is detected.

As shown in FIG. 6, the operation starts with receipt of a correctable error notification (step 610). The total count of the correctable errors in the CE data structure of the service processor is incremented (step 620). A determination is then made as to whether the total count of correctable errors is equal to or exceeds a predetermined threshold of allowable correctable errors (step 630). If the total count of correctable errors equals or exceeds the predetermined threshold, any further notifications of correctable errors is masked off until the current scrub cycle is complete (step 640). The masking of notifications at this point is intended to ensure that the processing capacity of the service processor 330 is not overwhelmed by handling correctable error notifications. As part of the scrubbing cycle being completed, the current table 410 is copied to the history table 420 as shown in step 520 of FIG. 5.

Figures 7A, 7B, 7C:
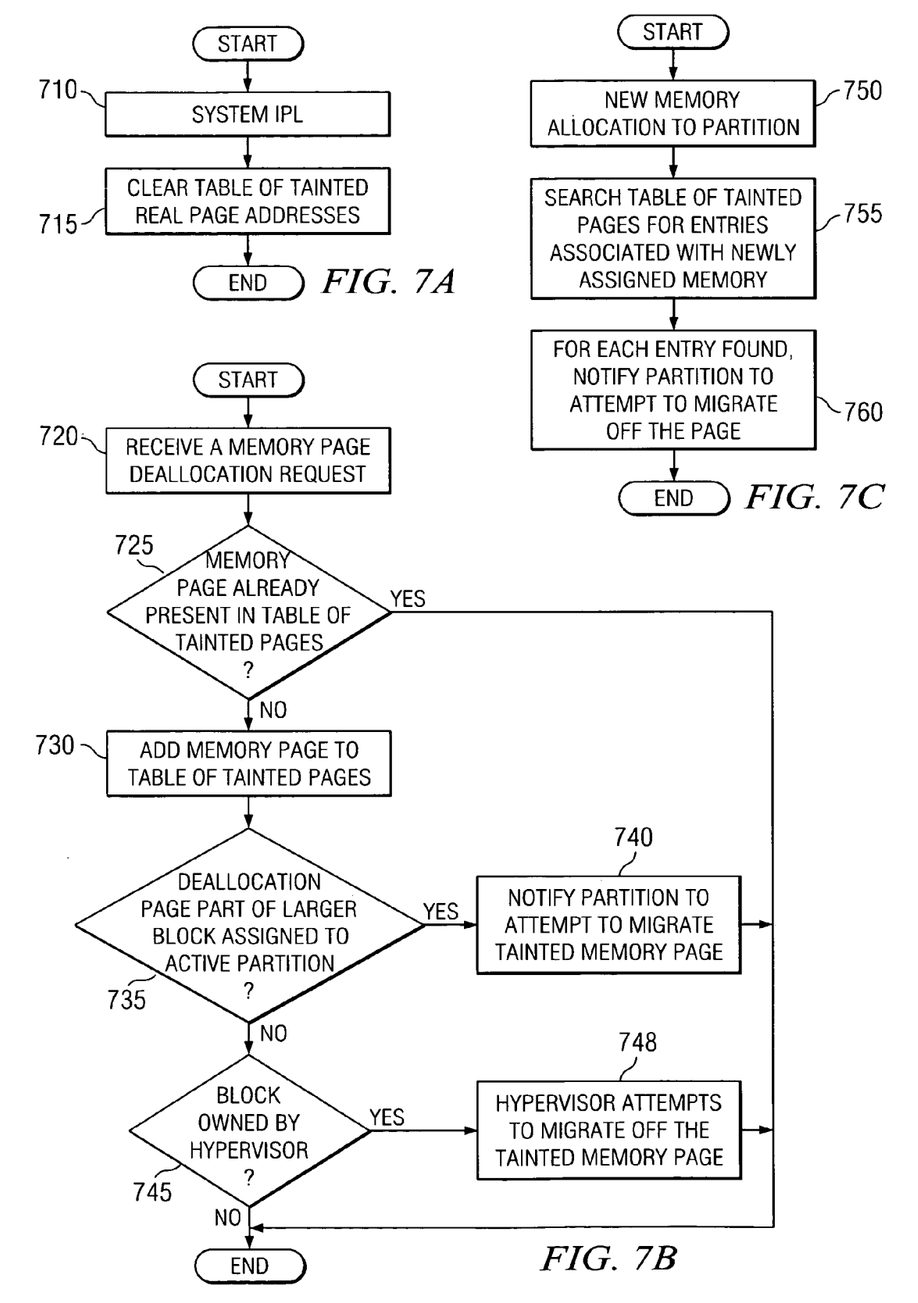
FIG. 7A illustrates an exemplary operation of the present invention upon a system reboot.
FIG. 7B illustrates an exemplary operation of the present invention when processing a memory page deallocation request.
FIG. 7C is a flowchart that outlines an exemplary operation of the present invention when a partition is rebooted or is assigned additional memory.

If the total count of correctable errors does not equal or exceed the threshold, the address and syndrome of the correctable error are looked for in the history CE table of the CE data structure (step 650). If found, this indicates that the same error has been found during the current scrubbing interval and the preceding one. The error appears persistent and is not cleared out by scrubbing. As a result, a memory page deallocation request associated with the error is sent to the hypervisor (step 660). If the memory page is owned by a partition, the hypervisor will forward the request to the operating system in the partition as shown in FIGS. 7B and 7C which illustrate an exemplary operation of the hypervisor in deallocating a memory page.

If the error is not found in the history table, a match of the error in the current CE table of the CE data structure is looked for (step 670). If a match is found in the current CE table, the count for the matching entry in the current CE table is incremented (step 680). If a match is not found in the current CE table, a determination is made as to whether there is room for an additional entry in the current CE table (step 690). If not, the operation goes to step 640 where any further CE notifications are masked off until the current scrub cycle completes. If there is additional room in the current CE table, then the correctable error is logged in the current CE table by recording the address and syndrome of the memory cell having the correctable error and giving it a count of 1 (step 695). After any of steps 640, 660, 680, or 695, the operation terminates.

With the above operation, the use of the history CE table that is updated after a scrub cycle is complete makes sure that the correctable error is persistent and is not something that can be removed by redundant bit line steering. The use of the total count of the total CE counter with thresholds helps to ensure that the service processor is not overwhelmed with CE notifications. The counters associated with the addresses/syndromes of the memory cells that experienced correctable errors provide debug statistics that may be provided as part of debug information in the error log when it is transmitted to the operating system.

The predetermined threshold to which the total count is compared may be set at any value that is deemed appropriate to the particular implementation of the present invention. In a preferred embodiment, the threshold is set to 32 which allows a small number of errors to be detected at each scrub cycle.

As previously mentioned above, a hypervisor layer, or system firmware layer, is provided which allows the system to be configured as a series of logical partitions where each partition is allocated some amount of system resources (either permanently or on a time-sharing basis) and runs its own separate image of an operating system. The hypervisor layer manages system resources for the partitions. For example, it divides system memory into real address pages, then assigns the memory pages to the partitions and into blocks of logical memory pages perceived by the operating system. The hypervisor is also responsible for handling memory page deallocation requests received from the service processor, such as illustrated in step 660 of FIG. 6.

FIGS. 7A–7C are flowcharts outlining an exemplary operation of a hypervisor, in accordance with the present invention, when processing a memory page deallocation request. FIG. 7A illustrates an operation of the hypervisor when the computing system and the hypervisor are started after a system reboot. As shown in FIG. 7A, the operation starts with a system initial program load (IPL) (step 710). The hypervisor then clears a table of tainted real page addresses that will be used to index page addresses with correctable errors (step 715). The operation then ends.

FIG. 7B illustrates an operation of the hypervisor in response to receipt of a memory page deallocation request from the service processor. As shown in FIG. 7B, the operation starts by receiving a request for deallocation from the service processor (step 720). The request includes a real address of the page that is to be deallocated.

A determination is made as to whether the memory page associated with the address included in the request is already present in the table of tainted pages (step 725). If the page is already in the table of tainted pages, the operation terminates because the page is already indicated as being tainted. If the page is not already in the table of tainted pages, then the memory page is added to the table of tainted pages (step 730). Since the table of tainted pages is not infinite in size, adding the memory page to the table of tainted pages may cause deletion of a page already noted in the table.

A determination is then made as to whether the page that is to be deallocated is assigned as part of a larger block to a currently active operating system partition (step 735). If so, then the hypervisor notifies the operating system to attempt to migrate the tainted memory page (step 740).

The notification can be done in a number of different ways. In a preferred embodiment, the notification is an error log entry communicated to the operating system. In the error log entry, the hypervisor records the logical page address associated with the tainted real page address. It should be noted that the operating system may not be able to migrate off the logical page address for a variety of reasons. In a preferred embodiment, if the operating system cannot migrate off the logical page dynamically, the page is left configured.

If the memory page is not owned by any current partition, a determination is made as to whether the block is owned by the hypervisor itself (step 745). If so, then the hypervisor attempts to migrate off the page (step 748). If the migration cannot be accomplished, the page remains configured to the hypervisor. If the memory page is not assigned to the hypervisor, it is not yet assigned anywhere in the system and thus, there is no need to deallocate it at this point. Thus, the operation simply terminates.

FIG. 7C is a flowchart that outlines an exemplary operation of the hypervisor of the present invention when a partition is rebooted or is assigned additional memory, both being considered cases where "new" memory is given to a partition. As shown in FIG. 7C, the operation starts with "new" memory being allocated to a partition (step 750). The hypervisor then searches the table of tainted pages to determine if there are any entries associated with the newly assigned logical memory page(s) (step 755). For each such entry found, the hypervisor notifies the partition to attempt to migrate off the page (step 760). The operation then terminates.

The notification to the operating system (step 735) in the above procedure may be performed before or after the memory pages in question are actually used. It is preferable that the notification be provided to the operating system before a tainted memory page is utilized by the operating system. However, practical implementations may require that the operating system have access to the memory page before deallocation notification occurs.

Thus, the present invention provides a mechanism for coordinating redundant bit line steering with dynamic memory page deallocation to achieve an improved memory management mechanism. With the present invention, memory scrubbing and redundant bit line steering operations are performed in parallel with handling of notifications of runtime correctable errors. When a correctable error is encountered during runtime, and the correctable error is determined to be persistent, then a dynamic memory page deallocation request is sent to the hypervisor. The determination of persistence is based on a history CE table that is populated by the operation of the memory scrubbing and redundant bit line steering mechanism of a service processor. Thus, only those correctable errors that persist for longer than one memory scrubbing cycle are subject to memory page deallocation.

Many modifications and alternative embodiments may be used to implement the functionality described above without departing from the spirit and scope of the present invention. For example, in the above described embodiments, it is presumed that the tainted page table is cleared in the hypervisor when the hypervisor is rebooted. To persist the tainted page table across hypervisor reboots it is necessary only that the table not be cleared on a hypervisor reboot and that the table be written in persistent memory where all the entries are "clear" when the system is initially manufactured.

In addition, the above embodiments presume that the system memory cannot be replaced in a system without performing a hypervisor reboot. If this is not the case, or if the tainted page table is to be persisted across hypervisor reboots, it is necessary for the service processor to be informed of repair events with memory and clear the page table of all entries associated with the memory that has been replaced. Notification to the operating system by the hypervisor of logical page tables that are usable again after a dynamic repair might also be required.

Also, as previously noted, software scrubbing mechanisms may be utilized rather than the preferred hardware based scrubbing mechanisms. The above operations performed by the hardware scrubbing mechanisms may also be performed by software scrubbing mechanisms. However, the software scrubbing mechanisms must be capable of understanding the physical memory associated with the memory extents being scrubbed.

Additionally, if a system does not include a hypervisor layer, then the service processor may be provided with the necessary code to handle all of the operations discussed above with regard to the hypervisor. Simplifications, such as all of the memory being associated with one operating system image so that there is no need to describe what happens if memory is dynamically added, may be made with such an embodiment. Furthermore, if knowledge of deallocated pages is not to persist across system reboots, then the need to maintain a table of tainted pages may not be required.

The embodiments discussed above are intended to coordinate the use of dynamic memory page deallocation with redundant bit line steering. Even without the redundant bit line steering, however, waiting until after a scrub cycle is complete to determine if a memory page for a memory cell needs to be deallocated is an improved mechanism for ensuring that the memory cell error is in fact persistent. Thus, the present invention may be implemented even in the absence of a redundant bit line steering mechanism.

Further, allowing a memory scrub to complete may be used to determine if memory extents have hardware errors that would be handled by redundant bit line steering if the hardware had that capability. This would allow the system to distinguish between single cell errors that could be eliminated through memory page deallocation without the need to replace any physical memory in the system and more catastrophic errors where dynamic memory page deallocation is liable to require too much system resource over time. Thus, the mechanisms of the present invention may be a better system of thresholding and handling of dynamic memory page deallocation compared to simply counting the number of occurrences of a correctable error at a particular memory cell location.

It should also be noted that while the above embodiments mask off additional CE notifications when there is no room in the CE table for additional entries, the present invention is not limited to such. Rather, as an alternative embodiment, the CE table may wrap such that previously recorded errors are overwritten, for example.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of managing memory in a computing device, comprising:
   receiving a notification of a runtime correctable error associated with a memory cell, wherein the receiving a notification step further comprises:
      determining if any memory extents in the memory have not been memory scrubbed;
      if memory extents exist that have not been memory scrubbed, identifying a next memory extent that has not been memory scrubbed;
      scrubbing the next memory extent to identify any memory cell errors;
      determining if any redundant bit lines are available for redundant bit line steering; and
      receiving the notification of the runtime correctable error if redundant bit lines are available for redundant bit line steering;
   determining if the runtime correctable error has persisted for longer than one memory scrub cycle; and
   requesting dynamic memory page deallocation for a page of memory associated with the memory cell with which the runtime correctable error is associated if the runtime correctable error has persisted for longer than one memory scrub cycle.

2. The method of claim 1, wherein determining if the runtime correctable error has persisted for longer than one memory scrub cycle includes:
   comparing an address of the memory cell with addresses in a history correctable error table; and
   determining that the runtime error has persisted for longer than one memory scrub cycle if the address of the memory cell is found in the history correctable error table.

3. The method of claim 2, wherein the history correctable error table is updated after each memory scrubbing operation cycle is completed.

4. The method of claim 2, further comprising:
   determining if the address of the memory cell is present in a current correctable error table identifying memory cells that have a correctable error identified in a current memory scrub cycle; and
   incrementing a count for a matching entry in the current correctable error table if the address of the memory cell is present in the current correctable error table.

5. The method of claim 4, further comprising:
   if the address of the memory cell is not present in the current correctable error table, determining if the current correctable error table has sufficient capacity for another entry;
   adding an entry to the current correctable error table corresponding to the address of the memory cell, if the current correctable error table has sufficient capacity; and
   setting a count associated with the entry to 1.

6. The method of claim 1, further comprising:
   comparing a total number of correctable errors to a predetermined threshold; and
   masking off further correctable error notifications until a current memory scrub cycle completes if the total number of correctable errors is equal to or greater than the predetermined threshold.

7. A computer program product stored in a computer readable medium for managing memory in a computing device, comprising:
   first instructions for receiving a notification of a runtime correctable error associated with a memory cell, wherein the first instructions further comprise:
      first sub-instructions for determining if any memory extents in the memory have not been memory scrubbed;
      second sub-instructions for identifying a next memory extent that has not been memory scrubbed, if memory extents exist that have not been memory scrubbed;
      third sub-instructions for scrubbing the next memory extent to identify any memory cell errors;
      fourth sub-instructions for determining if any redundant bit lines are available for redundant bit line steering; and
      fifth sub-instructions for receiving the notification of the runtime correctable error if redundant bit lines are available for redundant bit line steering;
   second instructions for determining if the runtime correctable error has persisted for longer than one memory scrub cycle; and
   third instructions for requesting dynamic memory page deallocation for a page of memory associated with the memory cell with which the runtime correctable error is associated if the runtime correctable error has persisted for longer than one memory scrub cycle.

8. The computer program product of claim 7, wherein the second instructions for determining if the runtime correctable error has persisted for longer than one memory scrub cycle include:
   instructions for comparing an address of the memory cell with addresses in a history correctable error table; and instructions for determining that the runtime error has persisted for longer than one memory scrub cycle if the address of the memory cell is found in the history correctable error table.

9. The computer program product of claim 8, wherein the history correctable error table is updated after each memory scrubbing operation cycle is completed.

10. The computer program product of claim 8, further comprising:
   instructions for determining if the address of the memory cell is present in a current correctable error table identifying memory cells that have a correctable error identified in a current memory scrub cycle; and
   instructions for incrementing a count for a matching entry in the current correctable error table if the address of the memory cell is present in the current correctable error table.

11. The computer program product of claim 10, further comprising:
   instructions for determining if the current correctable error table has sufficient capacity for another entry if the address of the memory cell is not present in the current correctable error table;
   instructions for adding an entry to the current correctable error table corresponding to the address of the memory cell, if the current correctable error table has sufficient capacity; and
   instructions for setting a count associated with the entry to 1.

12. The computer program product of claim 7, further comprising:
   fourth instructions for comparing a total number of correctable errors to a predetermined threshold; and
   fifth instructions for masking off further correctable error notifications until a current memory scrub cycle completes if the total number of correctable errors is equal to or greater than the predetermined threshold.

13. An apparatus for managing memory in a computing device, comprising:
   means for receiving a notification of a runtime correctable error associated with a memory cell;
      means for determining if any memory extents in the memory have not been memory scrubbed;
      means for identifying a next memory extent that has not been memory scrubbed, if memory extents exist that have not been memory scrubbed;
      means for scrubbing the next memory extent to identify any memory cell errors;
      means for determining if any redundant bit lines are available for redundant bit line steering; and
      means for receiving the notification of the runtime correctable error if redundant
   means for determining if the runtime correctable error has persisted for longer than one memory scrub cycle; and
   means for requesting dynamic memory page deallocation for a page of memory associated with the memory cell with which the runtime correctable error is associated if the runtime correctable error has persisted for longer than one memory scrub cycle.

14. The apparatus of claim 13, wherein the means for determining if the runtime correctable error has persisted for longer than one memory scrub cycle includes:
   means for comparing an address of the memory cell with addresses in a history correctable error table; and
   means for determining that the runtime error has persisted for longer than one memory scrub cycle if the address of the memory cell is found in the history correctable error table.

15. The apparatus of claim 14, wherein the history correctable error table is updated after each memory scrubbing operation cycle is completed.

16. The apparatus of claim 14, further comprising:
   means for determining if the address of the memory cell is present in a current correctable error table identifying memory cells that have a correctable error identified in a current memory scrub cycle; and
   means for incrementing a count for a matching entry in the current correctable error table if the address of the memory cell is present in the current correctable error table.

17. The apparatus of claim 16, further comprising:
   means for determining if the current correctable error table has sufficient capacity for another entry if the address of the memory cell is not present in the current correctable error table;
   means for adding an entry to the current correctable error table corresponding to the address of the memory cell, if the current correctable error table has sufficient capacity; and
   means for setting a count associated with the entry to 1.

18. The apparatus of claim 13, further comprising:
   means for comparing a total number of correctable errors to a predetermined threshold; and
   means for masking off further correctable error notifications until a current memory scrub cycle completes if the total number of correctable errors is equal to or greater than the predetermined threshold.

19. The method of claim 1 further comprising:
   determining if a predetermined threshold number of memory cell errors is exceeded during the scrubbing of the memory; and
   if the predetermined threshold number of memory cell errors is exceeded, performing redundant bit line steering.

20. The computer program product of claim 7 further comprising:
   instructions for determining if a predetermined threshold number of memory cell errors is exceeded during the scrubbing of the memory; and
   instructions for performing redundant bit line steering, if the predetermined threshold number of memory cell errors is exceeded.

21. The apparatus of claim 13 further comprising:
   means for determining if a predetermined threshold number of memory cell errors is exceeded during the scrubbing of the memory; and
   means for performing redundant bit line steering, if the predetermined threshold number of memory cell errors is exceeded.

* * * * *